United States Patent [19]

Wang

[11] Patent Number: 5,010,574
[45] Date of Patent: Apr. 23, 1991

[54] VECTOR QUANTIZER SEARCH ARRANGEMENT

[75] Inventor: Robert C. Wang, Mendham Township, Morris County, N.J.

[73] Assignee: AT&T Bell Laboratories, Murray Hill, N.J.

[21] Appl. No.: 365,642

[22] Filed: Jun. 13, 1989

[51] Int. Cl.$^5$ .............................................. G10L 5/00
[52] U.S. Cl. ........................................ 381/42; 381/43
[58] Field of Search .................................... 381/42, 43

[56] References Cited

U.S. PATENT DOCUMENTS

| 3,740,476 | 6/1973 | Atal. | |
|---|---|---|---|
| 4,100,370 | 7/1978 | Suzuki et al. | 381/42 |
| 4,727,354 | 2/1988 | Lindsay. | |
| 4,797,925 | 1/1989 | Lin. | |

OTHER PUBLICATIONS

"Speech Communication Human and Machine," by D. O'Shaughnessy, Published by Addison-Wesley Publishing Co., 1987, at pp. 226-231 and 309-310.
Proceedings of the International Conference on Acoustics, Speech and Signal Processing (ICASSP), 1986, "Efficient Procedures for Finding the Optimum Innovation in Stochastic Coders", by I. M. Trancoso and B. S. Atal, pp. 2375-2378.
IEEE Transactions on Communications, vol. 37, No. 5, May 1989, "Effect of Ordering the Codebook on the Efficiency of the Partial Distance Search Algorithm for Vector Quantization," by K. K. Paliwal and V. Ramasubramanian, pp. 538-540.
"Digital Processing of Speech Signals" by L. R. Rabiner and R. W. Schafer Published by Prentice Hall, 1978, at pp. 355-390.

Primary Examiner—Emanuel S. Kemeny
Attorney, Agent, or Firm—A. G. Steinmetz

[57] ABSTRACT

In an arrangement for coding multi-element signals such as used in speech or image processing, a plurality of N element reference signals representable in a prescribed vector space are stored. An N element input signal representable in the prescribed vector space is received and one of the reference signals is selected to represent the input signal. A set of signals each representative of the projection of one of the reference signals on a predetermined orientation in the prescribed vector space and a signal representative of the projection of the input signal on the predetermined orientation are formed. The reference signals are arranged according to their projections on the predetermined orientation. Candidates for the best matching reference signal are selected according to the differences between their projections on the prescribed orientation and the projection of the input signal on the prescribed orientation and the projection difference signals are utilized to determine the reference signal closest to the input signal in the prescribed vector space.

23 Claims, 9 Drawing Sheets

VECTOR QUANTIZER SEARCH ARRANGEMENT

FIELD OF THE INVENTION

The invention relates to signal coding and more particularly to vector quantizing arrangements for coding digital speech and image signals.

BACKGROUND OF THE INVENTION

In digital speech and image transmission systems, the complex nature of signals to be transmitted requires high bit rates and time consuming processing. As is well known in the art, it is usually sufficient to transmit an approximation of a speech or image signal that is perceptually acceptable. Consequently, the transmission arrangements may be simplified by determining a set of indexed codes covering the range of expected signals and transmitting the indexed code closest to the signal. The process is known as vector quantization wherein vectors representing speech or image signals from a given vector space are mapped into a reduced set of vectors within the original vector space or some other representative vector space by well known clustering techniques. The reduced set of vectors, along with the associated mapping, is chosen to minimize error according to some distortion measure. This representative set of vectors is referred to as a codebook and is stored in fixed memory.

In transmission systems, the codebooks generated by vector quantization are stored at both the transmitter and the receiver. An input signal to be transmitted is processed at the transmitter by searching the stored codes for the one that best matches the signal. The index of the best matching code is transmitted as representative of the input signal. A code corresponding to the transmitted index is retrieved from the codebook at the receiver so that the transmission bit rate is greatly reduced.

The best matching code, however, only approximates the input signal. A codebook with only a few entries permits a rapid search. The selected code, however, may be a poor representation of the input signal so that it is difficult to obtain accurate signal representation. If a codebook contains sufficient entries to accurately represent all possible input signals, a time consuming search through a very large set of codes is needed to determine the closest matching code. The processing delay may exceed the time allotted for transmission of the signal. In some cases, vector quantization cannot meet the signal quality standards. In other cases, a compromise must be made between the accuracy of signal representation and the speed of transmission. Various improvements in search processing have been proposed to obtain the advantages of vector quantization with a large codebook.

U.S. Pat. No. 4,727,354 issued Feb. 23, 1988 to R. A. Lindsay discloses a system for selecting a best fit vector code in vector quantization encoding in which a sequential search through a codebook memory puts out a series of prestored associated error code vectors. These error code vectors are compared in sequence over a period of time in order to select the minimum error code vector (best fit). A clocking-sequencing arrangement enables an output latch to hold the index number which represents the particular error code vector presently having the minimum distortion. Each new set of input vector components will be sequenced to search for the minimum error code vector and index for that particular set of input vector components.

U.S. Pat. No. 4,797,925 issued Jan. 10, 1989 to Daniel Lin discloses a method for coding speech at low bit rates in which each code sequence is related to a previous code sequence so that the computational complexity of using a stored codebook is reduced. The article "Efficient Procedures for Finding the Optimum Innovation in Stochastic Coders" by I. M. Trancoso and B. S. Atal appearing in the *Proceedings of the International Conference on Acoustics, Speech and Signal Processing (ICASSP)*, 1986, at pages 2375-2378, discloses an arrangement in which the signal and vectors are transformed into the frequency domain to simplify the search processing.

The article "Effect of Ordering the Codebook on the Efficiency of Partial Distance Search Algorithm for Vector Quantization" by K. K. Paliwal and V. Ramasubramanian appearing in the *IEEE Transactions on Communications*, Vol. 37, No. 3, May 1989, at pages 538-540, describes a search algorithm in which the distance between a codebook vector and a signal is evaluated as it is being calculated to remove vectors from consideration as early as possible. The algorithm is further improved by ordering the vectors in the codebook according to the sizes of their corresponding clusters.

The aforementioned schemes require complex signal processing for searching through complete codebooks to obtain accurate matching. It is an object of the invention to provide improved vector codebook searching with reduced signal processing requirements.

SUMMARY OF THE INVENTION

The foregoing object is achieved by an arrangement in which code search for a multi-component input signal is speeded up by generating a set of signals corresponding to the projection of the multi-component codes of a codebook on a predetermined orientation in a prescribed vector space. The projection of the input signal on the predetermined orientation is compared to the code projections from the codebook to reduce the signal processing in searching for the best matching code of the codebook.

The invention is directed to an arrangement for coding digital signals in which a plurality of N element reference signals representable in a prescribed vector space and a set of signals indexing the reference signals are stored. An N element input signal representable in the prescribed vector space is received and one of the reference signals is selected to represent the input signal. The selection includes forming a set of signals each representative of the projection of one of the reference signals on the predetermined orientation and a signal representative of the projection of the input signal on the predetermined orientation in the prescribed vector space. Reference signals are chosen responsive to the differences in their projections with the projection of the input signal on the predetermined orientation. The projection difference signals determine the reference signal having the minimum distance to the input signal.

DETAILED DESCRIPTION

Figure 1:
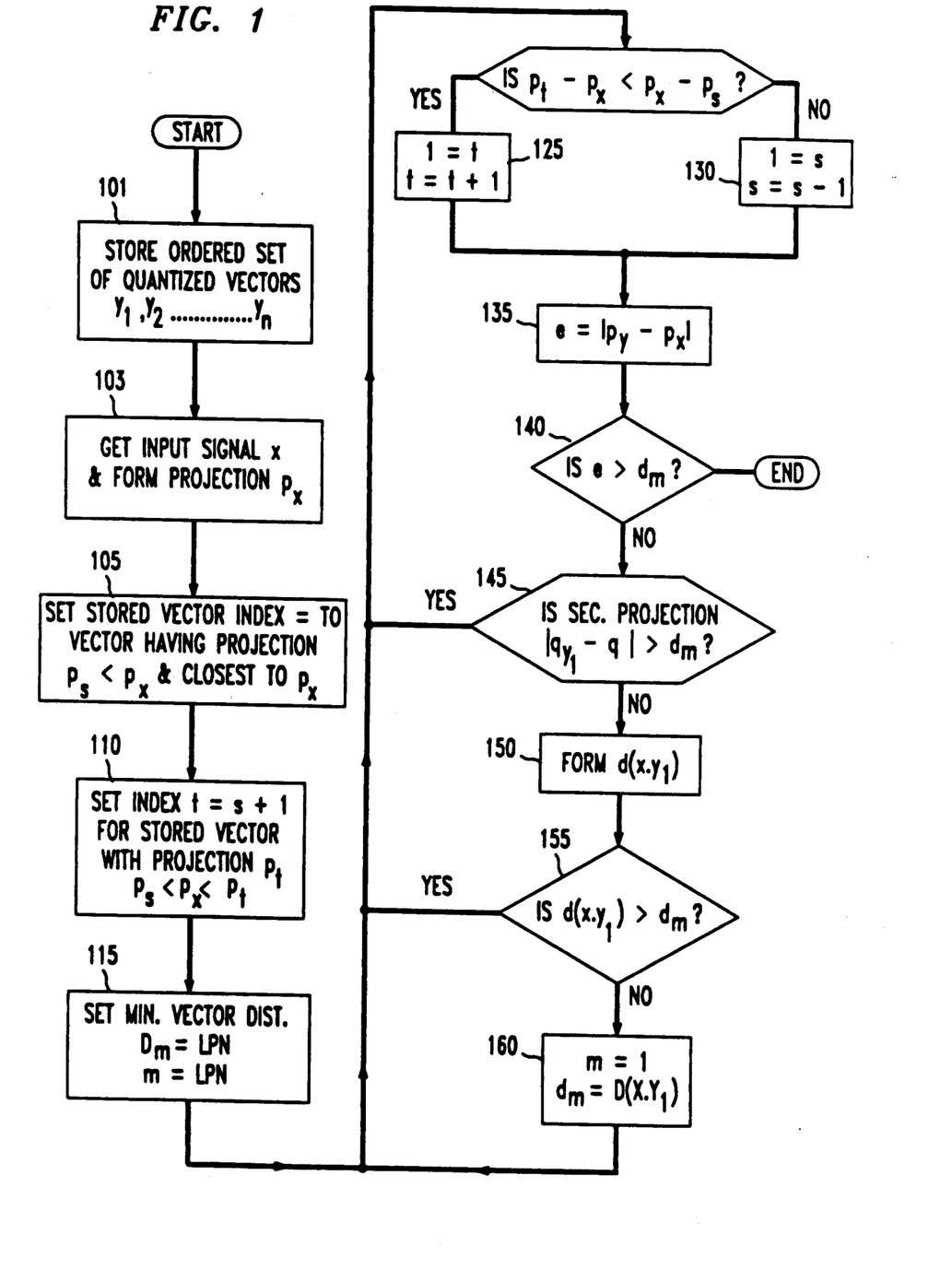
FIG. 1 is a flowchart of a vector selection method illustrative of the invention.

FIG. 1 is a flowchart showing an arrangement for searching through a codebook of N element reference signals to select the reference signal that best matches a N element input signal illustrative of the invention. The multi-element input signal $$x = (x_1, x_2, \ldots, x_N) \tag{1}$$

may represent a portion of image or speech pattern. Each reference signal may be a multi-element speech or image representative signal $$y_n = y_{n1}, y_{n2}, \ldots, y_{nN} \tag{2}$$

representable as a vector in a prescribed N dimension vector space. According to the invention, the time required for codebook searching is reduced by projecting the input signal and the reference signals on a predetermined orientation or dimension of the prescribed vector space. The comparison of the projections of the input signal to the projections of the reference signals greatly reduces the signal processing needed to obtain a best matching reference signal. By selecting a prescribed component as the predetermined orientation for projection, the signal processing required for the comparisons is further reduced. An additional reduction is obtained by arranging reference signals in the codebook in increasing projection order. In this way, the number of comparisons is also reduced.

Referring to FIG. 1, each of a set of reference signal vectors $y_1, y_2, \ldots, y_N$ representable as in equation (2) in a Euclidean space $R^N$ is projected on a line in the space. A projection value $P_y^n$ is obtained for each reference signal vector. The reference signal vectors are sorted in order of increasing projection values p in step 101 and stored in a codebook in that order (step 101). Any of the well known sorting techniques such as the binary sort described in "Fundamentals of Data Structures" by E. Horowitz and S. Sahni published by Computer Science Press, 1976, may be used. The projection ordered codebook is formed once and may be used thereafter for any input signal or sequence of input signals.

Each reference signal vector $y_n$ and each input signal vector has N dimensions. The line selected for the projections of the vectors may coincide with one of the components of the multi-component signal in the prescribed vector space. The projection should be a contraction mapping so that the projected distance e(u,v) between any two vectors, e.g., u and v defined as $$|p(u) - p(v)| \leq d(u,v) \tag{3}$$

where d(u,v) is the distance between vectors u and v in the Euclidean space $R^K$. In this way, the projection mapping preserves the closeness between vectors to increase the searching speed. As is well known in the art, the contraction requirement does not restrict the selection of the line for projection.

The search begins in step 103 after the codebook is stored. A signal corresponding to the projection of the input signal $p_x$ is formed as per step 103. In step 105, the codebook is searched to find the index s of the vector $y_s$ closest to the projection of the input signal with a projection $p_s$ less than or equal to the input signal projection $p_x$. This may be done by any of the searching methods well known in the art such as the binary search described in the aforementioned "Fundamentals of Data Structures" by E. Horowitz and S. Sahni. Once index s is determined, an index $$t = s + 1 \tag{4}$$

is formed in step 110. The input signal projection $p_x$ is bounded by $$p_s \leq p_x \leq p_t \tag{5}$$

the reference signal vectors having projections closest thereto.

A minimum vector distance signal $d_m$ and its index m are initially set to the largest possible number usable in the signal processor in step 115. The loop from step 120 to step 160 is then entered to determine the reference signal vector closest to the input signal vector, i.e., that provides the minimum distance signal $d_m$. In step 120, the difference between reference signal projection $p_t$ and input signal projection $p_x$ is compared to the difference between reference signal projection $p_s$ and input signal projection $p_x$. If projection $p_t$ is closer to $p_x$ than projection $p_s$, closest projection index i is set to t and index t is incremented (step 125). Otherwise index i is set to s and index s is decremented (step 130). In the first iteration of the loop from step 120 to step 160, the reference signal vectors found in steps 105 and 110 are used in step 120 as the candidates for the best matching vectors.

A signal $$e = |p_i - p_x| \tag{6}$$

corresponding to the distance between the input signal projection and the closest reference signal projection from step 125 or step 130 is produced in step 135. If projection difference signal e is greater than the current minimum distance signal $d_m$, the previously considered reference signal vector is closest to input signal x. This is so because the distance $d(y_i,x)$ is always greater than the corresponding projection distance e. Signal e is larger for each successive iteration since the projections of the initial codebook vector candidates are closest to the projection of the input signal. In accordance with the invention, the selection of the best matching reference signal is limited to a relatively small number of reference signals. Additionally, the signal processing for projection distances is considerably simpler than for vector space distances.

In the event, projection distance signal e of equation (5) is not greater than $d_m$ in step 140, $y_i$ is a possible candidate for the best matching reference signal. Step 145 is entered wherein the distance between $q_i$, the projection of $y_i$ along another or secondary line in the prescribed vector space, and $q_x$, the projection of x along the secondary line in the vector space is formed. This secondary projection $|q_{yi}-q_x|$ is compared with the previously obtained minimum distance signal $d_m$ (step 145). Where $d_m$ is exceeded, reference signal $y_i$ cannot be accepted as the best matching reference signal. This is evident since any projection distance e for $y_i$ is always less than the corresponding vector space distance $d(y_i,x)$. Control is then returned to step 120 to consider the reference signal with the next closest projection.

If the secondary projection in step 145 is less than $d_m$, reference signal is a better candidate than reference signal $y_m$. The vector space distance $d(y_i, x)$ generated (step 150) is compared to the minimum distance signal $d_m$ (step 155). Step 160 is entered from step 155 when vector space distance $d(y_i,x)$ is less than $d_m$. The codebook index m for the minimum distance vector is then set equal to i and $d_m$ is set equal to $d(y_i,x)$. Control is then passed to step 120 for the next iteration. Where $d(y_i,x)$ is greater than $d_m$ in step 155, control is passed directly to step 120. The minimum distance signal $d_m$ remains unaltered.

Figure 9:
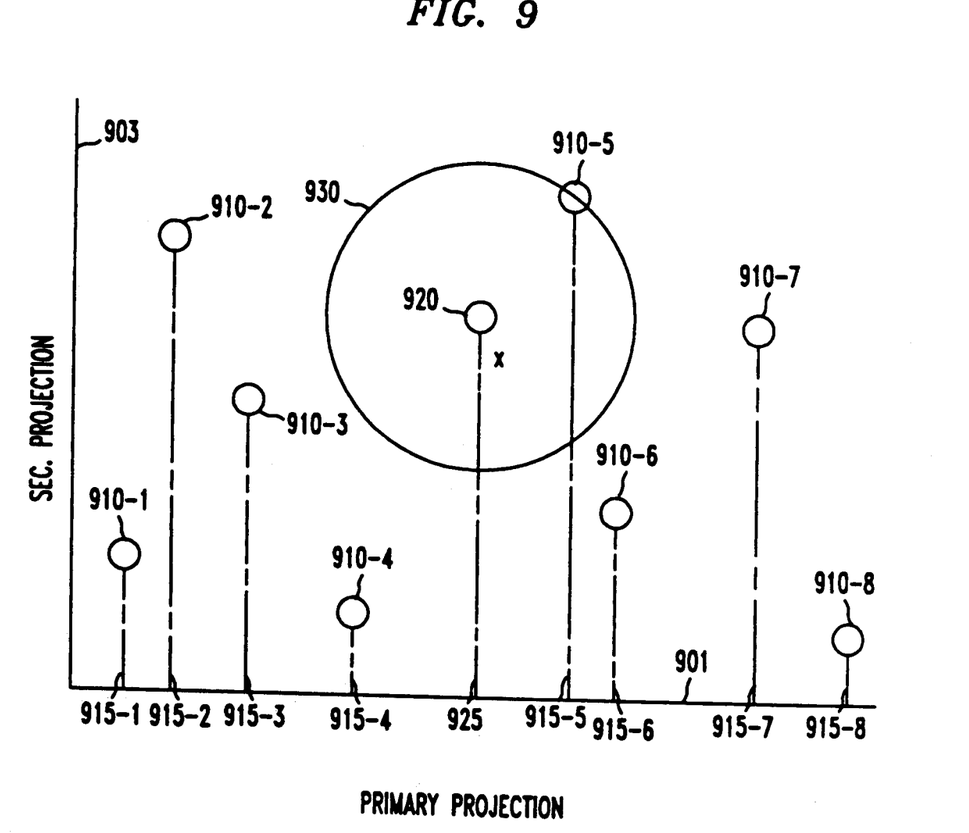
FIG. 9 is a graph illustrating the search operations shown in the flowchart of FIG. 1.

FIG. 9 shows the locations of an input signal and a plurality of reference vectors in a two dimensional view that illustrates the quantization method of the invention. Primary projections are taken along the horizontal dimension 901 and secondary projections are taken along the vertical dimension 903. Reference signal vectors $y_1$ through $y_8$ are located at points 910-1 through 910-8, respectively. The primary projections of vectors $y_1$ through $y_8$ are at points 915-1 through 915-8. Input signal x is located at point 920 and its primary projection is at point 925 between the projection points 915-4 and 915-5 for reference signals $y_4$ and $y_5$. Circle 930 centered at the location of input signal x (point 920) indicates the distance $d(x,y_5)$ to closest reference signal $y_5$.

Table 1 lists the reference signal vector coordinates, the primary projections ($|p_{yj}-p_x|$), the secondary projections ($|q_{yi}-q_x|$), and the distances $d(x,y_i)$.

TABLE 1

| Ref. Sig. | Prim. Coord. | Sec. Coord. | Prim. Proj. | Sec. Proj. | Dist. to Input Sig. |
|---|---|---|---|---|---|
| y1 | 2 | 6 | 12 | 12 | 16.97 |
| y2 | 5 | 21 | 9 | 3 | 9.49 |
| y3 | 7 | 14 | 7 | 4 | 8.06 |
| y4 | 12 | 5 | 2 | 13 | 13.15 |
| y5 | 17 | 22 | 3 | 4 | 5.00 |
| y6 | 18 | 10 | 4 | 8 | 8.94 |
| y7 | 20 | 16 | 6 | 2 | 6.32 |
| y8 | 24 | 2 | 10 | 16 | 18.87 |

Referring to FIG. 1, The reference signal vectors are arranged in a codebook store according to the primary projections 915-1 through 915-8 as per step 101. Since the projections correspond to the primary projection coordinate, these values are already stored. There is no need to calculate the projection values. The coordinates of input signal x (14, 18) are obtained in step 103 and the codebook search of steps 105 and 110 results in the initial projection indices s=4 and t=5. The minimum vector distance and the corresponding vector index are initially set arbitrarily to a number larger than the largest possible distance signal (LPN) in step 115.

At the start of the first iteration, s=4, t=5 and $d_m$=LPN. Primary projection $|p_x-p_y^4|$ is determined to be less than primary projection $|p_y^5-p_x|$ in step 120. i is then set to 4 and s is decremented to 3 in step 130. The projection signal e=2 is formed in step 135. Since primary projection signal e is less than $d_m$=LPN, the secondary projection $|q_{y4}-q_x|$ is compared to $d_m$=LPN in step 145. The distance signal $d(x,y_4)$=13.15 generated (step 150) is found to be less than $d_m$=LPN (step 155). $d_m$ is set to $d(x,y_4)$ in step 160 and step 120 is reentered for the second iteration.

During the second iteration, i is set to 5 and t is incremented to 6 in step 125 since primary projection $|p_{y5}-p_x|$ is less than $|p_{y3}-p_x|$. Projection $|p_{y5}-p_x|$=3 is less than $d_m$=13.15 (step 135) and secondary projection $|q_{y4}-q_x|$=4 is less than 13.15 (step 140). Distance signal $d(x,y_5)$=5 is generated in step 150 and is compared to 13.15 in step 155. As a result, minimum distance signal $d_m$ becomes 5 and m becomes 5 in step 160.

i is set to 6 and t is incremented to 7 in step 125 of the third iteration since primary projection $|p_{y6}-p_x|$=4 is less than $|p_{y3}-p_x|$ (step 120). The primary projection $$e=|p_{y6}-p_x|=4$$

is less than $d_m$ but the secondary projection $$|q_{y6}-q_x|=8$$

is greater than $d_m$. Signal $d_m$ is not altered and the fourth iteration is initiated in step 120. Index i changes to 7 and t is incremented to 8 (step 125). Since primary projection $$e=|p_{y7}-p_x|=6$$

is greater than minimum distance signal $d_m$=5 (step 140), the selection loop is exited from step 140. The best fitting reference signal vector has been determined as $y_5$ and the corresponding index signal m=5 is available for transmission.

Advantageously, the projection arrangement according to the invention reduces the scope of a search through a reference signal codebook and reduces the signal processing needed to compare the input signal to each reference signal vector in the limited search. Two dimensions have been used in the foregoing example for purposes of illustration. It is to be understood that the method is readily extendible to multidimensional vector spaces such as those employed to represent complex speech and image signals.

Figure 2:
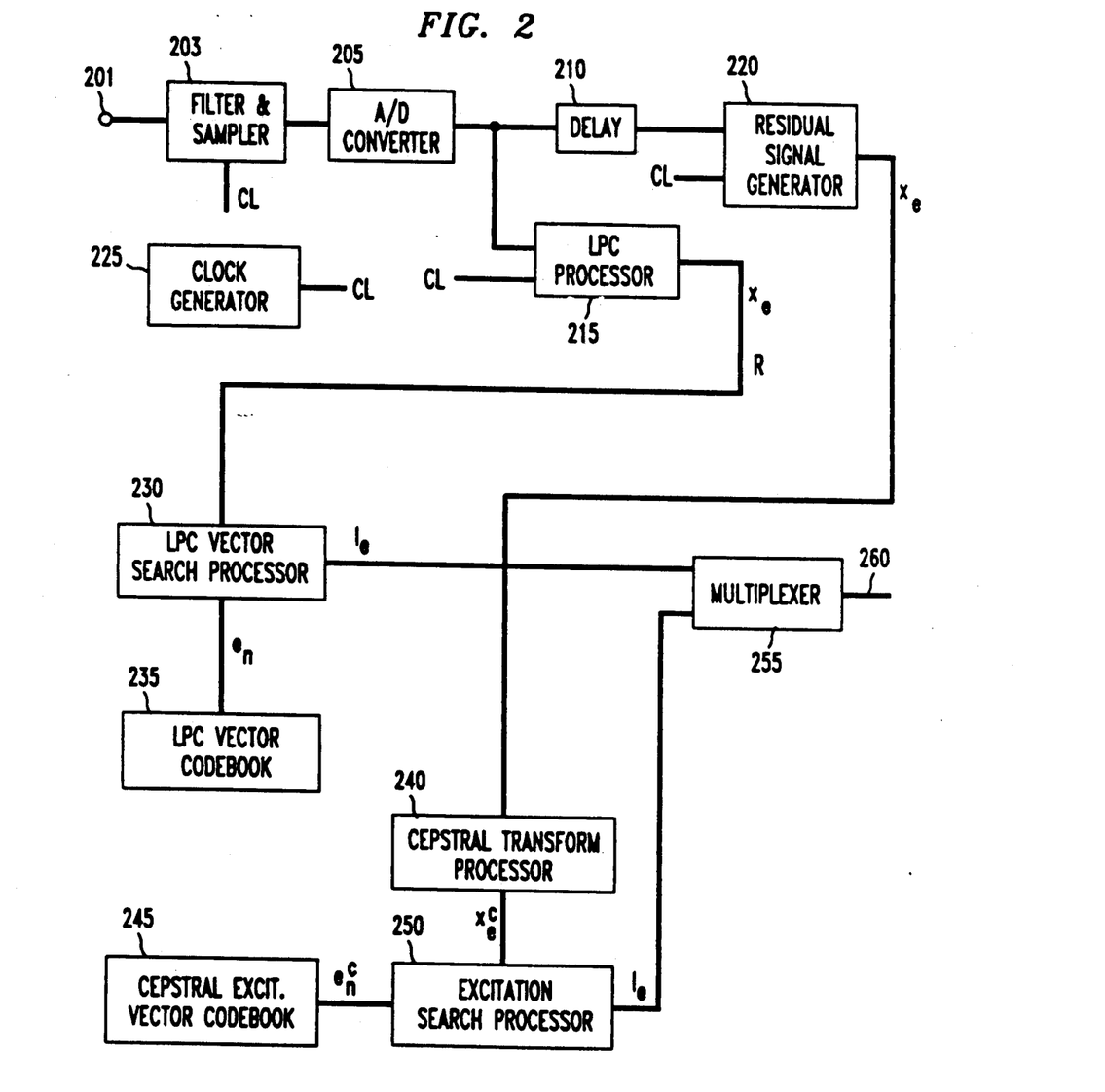
FIG. 2 is a general block diagram of a vector quantization speech coding arrangement illustrative of the invention.

FIG. 2 shows a general block diagram of a speech processor illustrative of the invention. In FIG. 2, a speech pattern such as a spoken message is received by a transducer 201 such as a microphone. The analog speech signal obtained from the microphone is band limited and converted into a sequence of pulse samples in filter and sampler 203. The filtering may be arranged to remove frequency components of the speech signal above 4.0 KHz and the sampling may be at an 8 KHz rate as is well known in the art. The timing of the samples is controlled by sample clock signal CL from clock generator 225. Each sample from filter and sampler 203 is transformed into an amplitude representative digital signal in analog-to-digital converter 205.

The sequence of digital speech samples from converter 205 is applied to linear predictive processor 215. This processor, as is well known in the art, partitions the speech samples into time intervals or frames of 10 to 20 milliseconds and generates a set of linear prediction coefficient signals $x_a = x_1, x_2, \ldots, x_p$ for each time frame. The coefficient signals represent the predicted short term spectrum of the $N > p$ speech sample of the time interval. A signal R corresponding to the autocorrelation coefficient for the time frame is also generated in processor 215. Delay circuit 210 delays the digital samples from converter 205 to allow time to form coefficient signals $x_a$ for a time interval. The delayed digital samples supplied to residual signal generator 220 in which the delayed speech samples and the prediction parameters $x_a$ to form a signal corresponding to the difference therebetween. The formation of the predictive parameter and residual signals may be performed according to the arrangement disclosed in U.S. Pat. No. 3,740,476 issued to B. S. Atal, June 19, 1973, or by other techniques well known in the art.

According to the invention, a linear predictive coefficient (LPC) codebook 235 stores a set of reference signals covering the range of LPC signals $a_n = a_{n1}, a_{n2}, \ldots, a_{np}$ expected from LPC processor 215 in accordance with well known vector quantizing procedures. The LPC signal $x_a$ for each time interval is applied to LPC vector search processor 230 and the LPC vector codebook is searched for the best matching reference signal therein. An index signal $I_a$ corresponding to the best matching reference signal for the time interval is then transmitted to represent the LPC signal from processor 215.

In like manner, a codebook 245 stores reference excitation signals covering the range of residual signals from residual signal generator 220. While many forms of residual signals may be used, it has been found that use of the cepstral type signal provides search advantages. Consequently, the excitation codebook stores cepstral reference signals. For comparison purposes, the residual signal $x_e$ from residual signal generator 220 is transformed to the cepstral domain in cepstral transform processor 240 before being applied to excitation search processor 250. In each time interval, the cepstral excitation codebook is searched for the cepstral reference signal $e_n{}^c$ that best matches the cepstral transformed residual signal $x_e{}^c$ from processor 240. The index signal $I_e$ corresponding to the best matching cepstral reference signal is used to represent the residual signal from generator 220. The LPC representative index signal and the excitation representative index signal for each time interval are combined in multiplexer 255 for transmission.

Figure 3:
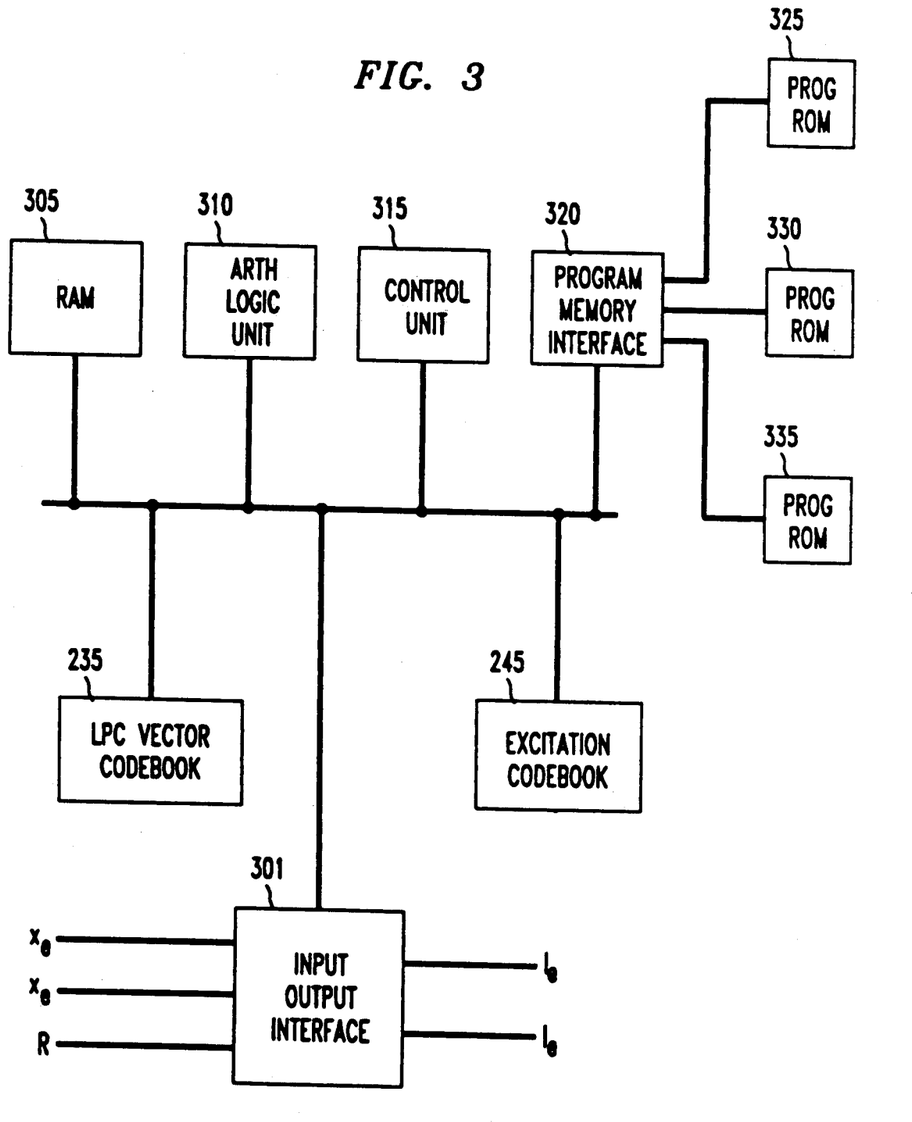
FIG. 3 is a general block diagram of a signal processor that may be used to implement the flowchart of FIG. 1.

FIG. 3 is a general block diagram of a digital signal processor such as the Western Electric type DSP 16 Digital Signal Processor which may be used in the search processing operations in FIG. 2. Referring to FIG. 3, input-output interface 301 receives the LPC signal $x_a$ from LPC processor 215 and the residual signal $x_e$ from residual signal generator 220 in each time interval and transfers these signals to random access memory 305 via bus 340. After the index signals $I_a$ and $I_e$ are identified in FIG. 3, they are transferred to multiplexer 255 via the interface. Memory 305 stores signals $x_a$, $x_e$ and other signals required to determine the best fitting reference vectors and arithmetic logic unit performs the signal processing required for the cepstral transformations and LPC and excitation search operations. Control unit 315 controls the sequence of operations of the processor of FIG. 3 responsive to instructions from program read only memories (ROM) 325, 330 and 335. The instructions from ROMs 325, 330 and 335 are supplied to control unit 315 via program memory interface 320. Excitation codebook 245 stores the cepstral excitation reference signals and LPC vector codebook 235 stores the linear predictive reference signals as aforementioned with respect to FIG. 2.

Figure 5:
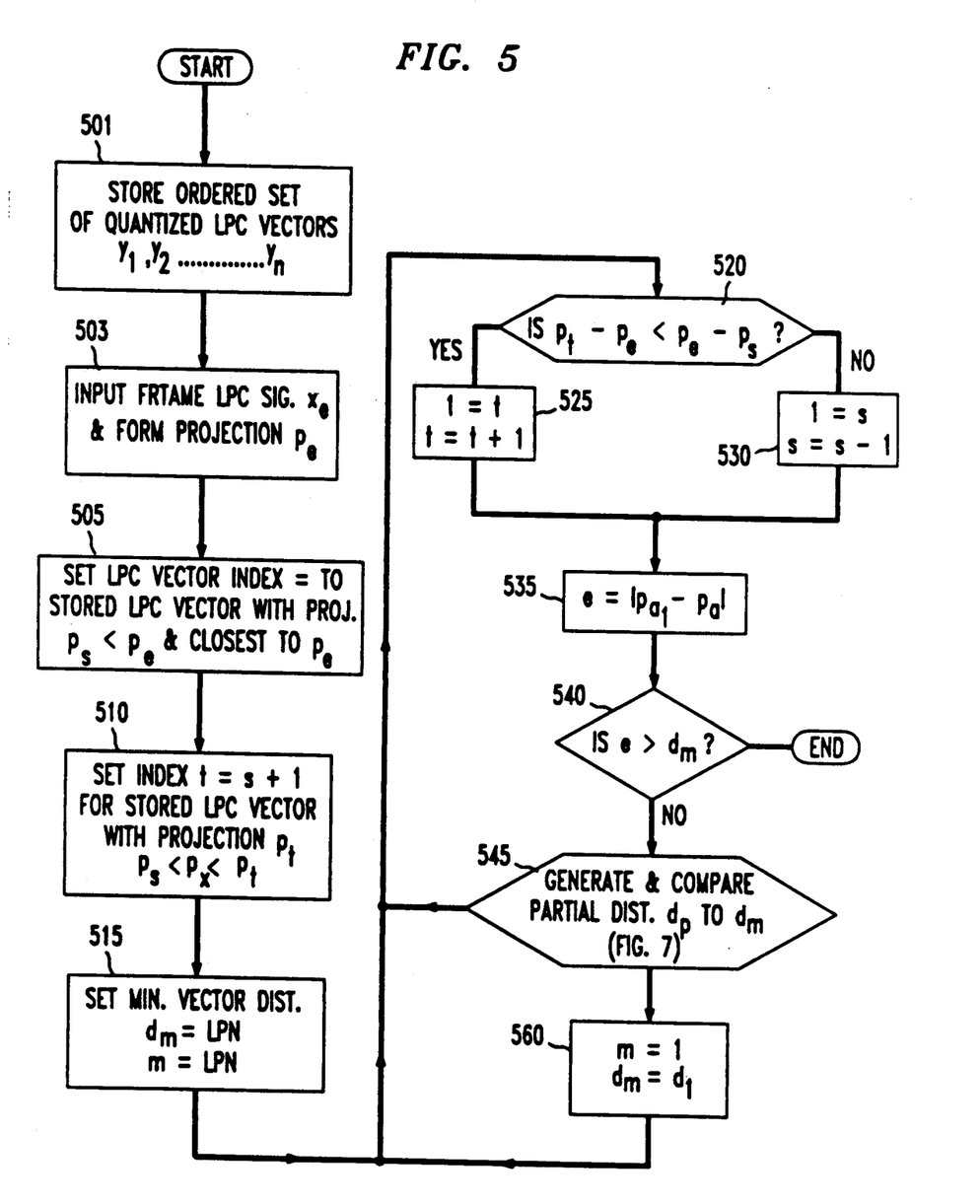
FIG. 5 is a flowchart illustrating the operation of the linear predictive vector quantization search arrangements in FIG. 2.

The flowchart of FIG. 5 illustrates the LPC search operations of FIG. 3 and corresponds to the set of instructions permanently stored in program ROM 335. Referring to FIG. 5, a set of LPC references signals $a_1, a_2, \ldots, a_N$ covering the range of expected LPC signals $x_a$ are generated and stored in codebook memory 235 (step 501). As mentioned with respect FIG. 1, the reference signals are stored in a predetermined order corresponding to a selected component of the multi-component signal. Each stored LPC reference signal comprises p coefficients. A component corresponding to a distortion measure for the LPC reference signal $a'_n R_n a_n$ is also stored. $R_n$ is the autocorrelation matrix for the reference signal. The stored LPC reference signal $a_n$ takes the form $$a_n = a_{n1}, a_{n2}, \ldots, a_{np}, a'_n R_n a_n \qquad (7)$$

As per step 501, the set of LPC reference signals are stored in increasing order of the projection component $a'_n R_n a_n$. Once the ordered codebook is generated, it may be stored in read only memory 235 for use in the speech coder of FIG. 2.

The LPC processor 215 produces an LPC signal for each time frame obtained from LPC processor 215 and applies the signal to interface circuit 301 of FIG. 3. The input LPC signal $$x_a = x_{a1}, x_{a2}, \ldots, x_{ap}, x'_a R_{xa} x_a \qquad (8)$$

is placed in memory 305 under control of instruction in program store 325 via control unit 315 (step 503). The projection component $x'_a R_x x_a$ is produced in arithmetic logic unit 310 and stored in memory 305. The search for the stored reference vector having a projection $$p_s = a'_s R_s a_s \qquad (9)$$

which is the stored vector closest to but less than the input signal projection $$p_a = a' R_a a \qquad (10)$$

is performed according to step 505. Index s is set and index t is set to s+1 so that input signal projection $p_a$ is bracketed between projections $p_s$ and $p_t$ (step 510). The minimum distance signal $d_m$ and its index m are initially set to LPN in step 515 as previously described with respect to FIG. 1. The loop from step 520 to 560 is then iterated to determine the index for the reference signal that best matches input LPC signal $x_a$.

In step 520, the difference between reference signal projection $p_t$ and input signal projection $p_a$ is compared to the difference between reference signal projection $p_s$ and input signal projection $p_a$. The smaller of the two projection distances is chosen. If projection $p_t$ is closer to $p_a$, step 525 is entered, closest projection index i is set to t and index t is incremented (step 525). Otherwise index i is set to s and index s is decremented (step 530). In the initial iteration of the loop from step 520 to step 560, the reference signal projections found closest to the input signal projection in steps 505 and 510 are used in step 520 as the candidates for the best matching vectors.

A projection distance signal $$e = |p_{ai} - p_a|  \quad (11)$$

corresponding to the distance between the input signal projection and the closest reference signal projection from step 525 or step 530 is produced in step 535. If projection difference signal e is less than the current minimum distance signal $d_m$, reference signal $a_i$ can be the closest reference signal vector to input signal $x_a$. The secondary projection comparison described with respect to FIG. 1 may be used as an additional check. For LPC reference signals, it may be difficult to choose a secondary projection. Consequently, a partial distance comparison of step 545 is used. In step 545, the distance signal is generated component by component and compared to the minimum distance signal $d_m$ after each component is added. If one of the partial distances in step 545 becomes larger than the minimum distance $d_m$, the distance between the LPC reference vector $a_i$ and the input signal LPC vector $x_a$ is too large. Control is then returned to step 520 to consider the next candidate reference signal.

Figure 7:
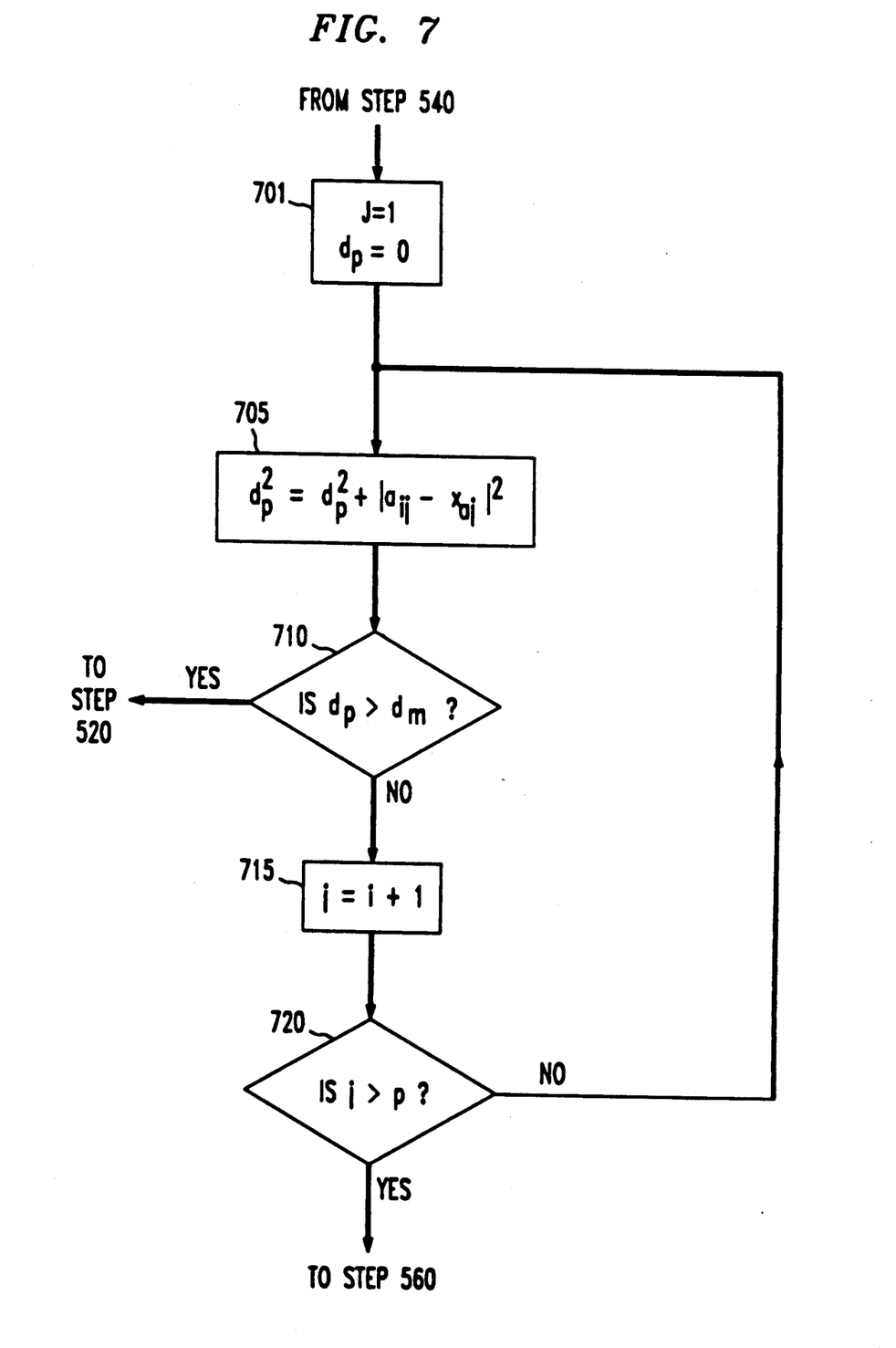
FIG. 7 is more detailed flowchart of the partial distance comparison operations of the flowchart of FIG. 6.

The partial distance generation and comparison operation of step 545 is shown in greater detail in the flowchart of FIG. 7. Referring to FIG. 7, step 701 is entered if the projection distance e is less than the previously determined minimum distance in step 540. In step 701, reference signal component index j is set to 1 and the partial distance signal $d_p$ is set to zero. The partial distance is incremented by component j in accordance with $$d_p^2 = d_p^2 + |a_{ij} - x_{aj}|^2 \quad (12)$$

as per step 705. When j is one, $d_i$ corresponds to the absolute value of the difference signal $a_{i1} - x_{a1}$. The partial distance is compared to the previously determined minimum distance signal (step 710). If the partial distance of equation (12) at any j is greater than the minimum distance $d_m$, step 520 is reentered from step 710. Otherwise, component index j is incremented in step 715 and step 705 is reentered from step 720 until the last component j=p is added to the partial distance signal. At that point, candidate LPC reference signal $a_i$ is determined to be a better matching candidate. Step 560 is entered wherein m is set to i $d_m$ is set to $d_p$ found in step 545 and step 520 is reentered.

When projection difference signal e in step 540 is greater than the current minimum distance signal $d_m$, the previously considered reference signal vector $a_m$ is selected as closest to input signal $x_a$. As aforementioned with respect to FIG. 1, the closest projections $p_s$ and $p_t$ are selected for the initial codebook vector candidates and the projection signals increase for each succeeding iteration of the loop from step 520 to step 560. At this time, the index for the selected reference signal $I_a$ is set to m in the processor of FIG. 3 and is sent to multiplexer 555 of FIG. 2 for transmission on channel 260.

In addition to determining the index for the selected LPC reference signal, the coder of FIG. 2 also provides an index signal $I_e$ corresponding to the excitation reference signal that best matches residual signal $x_e$ generated in residual signal generator 220. The residual signal for a time frame interval, however, is relatively complex. For example, $x_e$ for a 16 ms speech pattern interval may have 128 randomly varying components. A time domain vector quantization codebook for the residual may be used. A more compact codebook can be constructed by transforming the time domain reference signal entries to the cepstral domain by methods well known in the art. Advantageously, a cepstral domain reference signal corresponding to residual $x_e$ has fewer components, e.g., 16, and the components are well behaved rather than random. The formation and use of the cepstrum in signal processing is described in "Digital Processing of Speech Signals" by L. R. Rabiner and R. W. Shafer published by Prentice Hall, 1978, at pages 355-390, and "Speech Communication Human and Machine" by D. O'Shaughnessy published by Addison-Wesley Publishing Co., 1987, at pages 226-231 and 309-310.

The residual signal $$e_n = e_1, e_2, \ldots, e_N \quad (13)$$

where N may be 128 is transformed to the cepstral domain by forming the transform signal $$\log|DFT(e_n)| \quad (14)$$

and generating the Inverse Discrete Fourier Transform $$DFT^{-1}(\log DFT|e_n|) = e_1^c, e_2^c, \ldots, e_M^c \quad (15)$$

where M may be 32. In this way, the residual signal is put into more manageable form.

Codebook 245 in FIGS. 2 and 3 comprises a set of cepstral domain excitation reference signals stored in order of increasing primary projection values. Each signal $e^{ci}$ is stored as a cepstral vector having M components.

$$e_i^c = e_{i1}^c, e_{i2}^c, \ldots, e_{iM}^c \quad (16)$$

Figure 6:
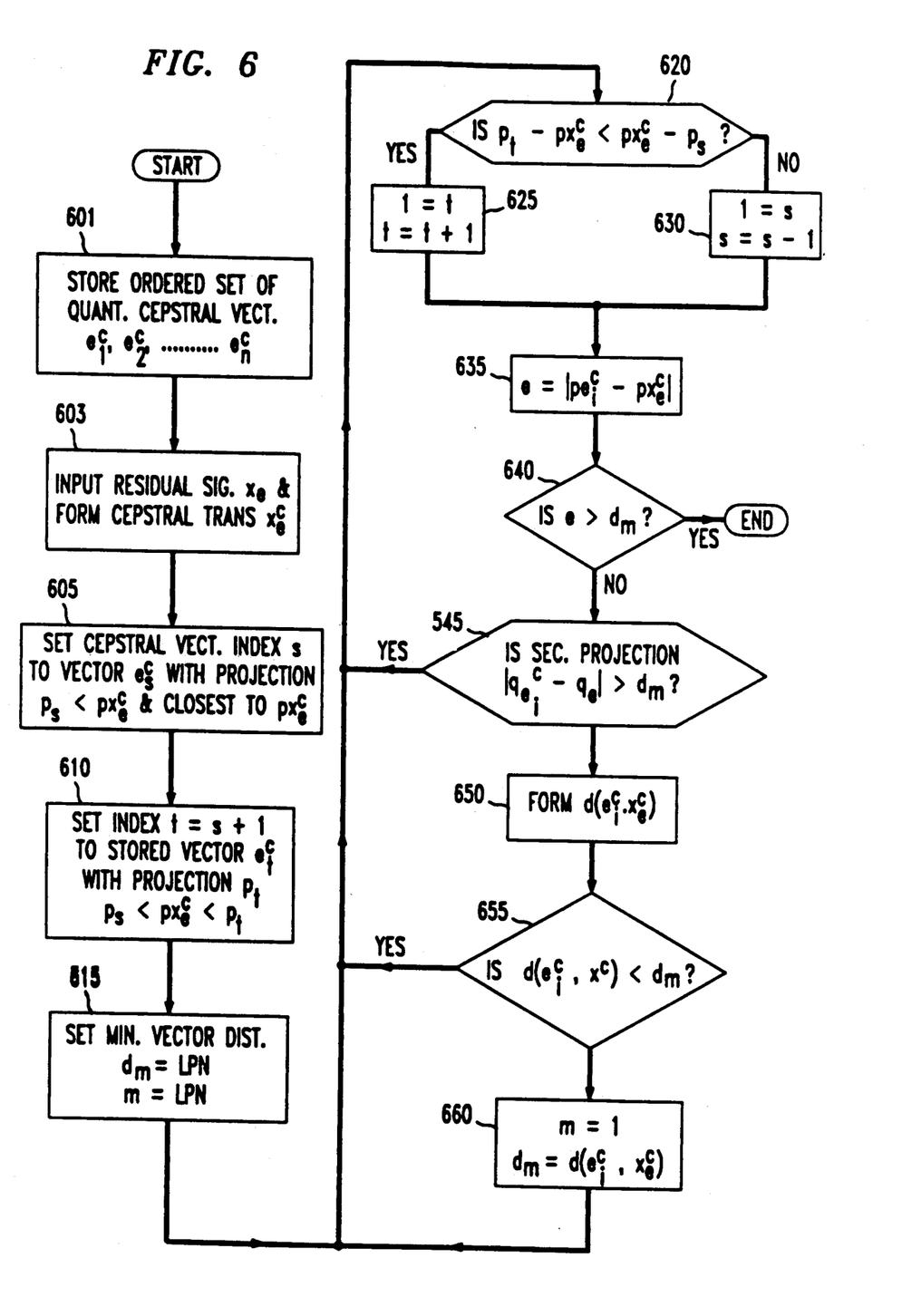
FIG. 6 is a flowchart illustrating the operation of the excitation vector search arrangements in FIG. 2.

Component $e^{ci1}$ may be selected as the primary projection and $e^{ci2}$ may be selected as the secondary projection. The residual signal $e_x$ is transformed into the cepstral signal $$x_e^c = x_{e1}^c, x_{e2}^c, \ldots, x_{eM}^c \quad (17)$$

in cepstral transform processor 240 of FIG. 2. The cepstral transform processor may be implemented along with other functions in the signal processor arrangement of FIG. 3 or by other means known in the art. Once signal $e^{cx}$ is obtained, the signal processor of FIG. 3 performs the excitation search processing operations illustrated in the flowchart of FIG. 6. These operations are under control of instructions stored in program memory 230.

Referring to FIG. 6, the set of quantized reference cepstral vectors $e_1^c, e_2^c, \ldots, e_N^c$ are permanently stored in cepstral excitation vector codebook 245 (step 601) in the order of the primary projection component. The input residual signal $x_e$ from residual signal generator 220 is applied to cepstral transform processor 240 wherein the cepstral signal of equation 17 is generated (step 603). The codebook is searched to determine index s corresponding to the projection $p_s$ of cepstral excitation reference signal vector $e_s^c$ that is less than the projection $p_e$ of the cepstral transformed input signal residual $x_e^c$ (step 605). Excitation reference signal index $t=s+1$ is then produced (step 610) corresponding to the closest excitation reference signal $e_t^c$ satisfying the relationship $$p_s < p_e < p_t \qquad (18)$$

Cepstral excitation reference signal vectors $e_s^c$ and $e_t^c$ have projections along component $e^{c1}$ closest to the excitation input signal component $x^{ce1}$. A minimum distance signal $d_m$ and its index m are initially set to the largest possible number in the signal processor of FIG. 3 (step 615) and the loop from step 620 to step 660 is iterated to determine the index of the closest matching excitation reference signal in the cepstral domain.

In step 620, the difference between reference signal projection $p_t$ and input signal projection $p_e$ is compared to the difference between reference signal projection $p_s$ and input signal projection $p_e$. If projection $p_t$ is closer to projection $p_e$ than projection $p_s$, closest projection index i is set to t and index t is incremented (step 625). Otherwise index i is set to s and index s is decremented (step 630). In the first iteration of the loop from step 620 to step 660, the cepstral reference signal vectors found in steps 605 and 610 are used in step 620 as the candidates for the best matching cepstral vectors.

A signal $$e = |p_{ei}^f - p_{x_e}^c| \qquad (19)$$

corresponding to the distance between the input signal projection and the closest reference signal projection from step 625 or step 630 is produced in step 635. If projection difference signal e is greater than the current minimum distance signal $d_m$, the previously considered cepstral reference signal vector is closest to excitation input signal $x_e$. Index signal $I_e$ is then set to m in the processor of FIG. 3 and is output from interface 301. The selection is possible because the distance $$d^2(e_1^c, x_e^c) = \Sigma(e_{if} - x_{ef})^2 \qquad (20)$$

is always greater than the corresponding projection distance e. Signal e is larger for each successive iteration since the projections of the initial codebook cepstral vector candidates are closest to the projection of the input signal. As aforementioned with respect to FIG. 1, the selection of the best matching reference signal is limited to a relatively small number of reference signals and the signal processing for projection distances is considerably simpler than for vector space distances.

In the event projection distance signal e of equation 19 is not greater than $d_m$ in step 640, $e_i^c$ is a possible candidate for the best matching excitation reference signal. Step 645 is entered wherein the distance between $q_i$, the projection of $e_i^c$ along the secondary projection line in the cepstral vector space, and $q_e$, the projection of $x_e^c$ along the secondary line in the cepstral vector space is formed. This secondary projection $|q_{ei}^c - q_{x_e}^c|$ is compared with minimum distance signal $d_m$ (step 645). Where $d_m$ is exceeded, reference signal $e_i^c$ cannot be accepted as the best matching reference signals since any projection distance e for $e_i^c$ is always less than the corresponding cepstral vector space distance $d(e_i^c, x_e^c)$. Control is then returned to step 620 to consider the reference signal with the next closest projection.

If the secondary projection in step 645 is less than $d_m$, reference signal $e_i^c$ is a better candidate than reference signal $e_m^c$. The cepstral space distance $d(e_i^c, x_e^c)$ generated in step 650 is compared to the minimum distance signal $d_m$ (step 655). Step 660 is entered from step 655 when cepstral vector space distance $d(e_i^c, x_e^c)$ is less than $d_m$. The codebook index m for the minimum distance cepstral vector is then set equal to i and $d_m$ is set equal to $d(e_i^c, x_e^c)$. Control is then passed to step 620 for the next iteration. Where $d(e_i^c, x_e^c)$ is greater than $d_m$ in step 655, control is passed directly to step 620. The minimum distance signal $d_m$ remains unaltered.

In each time frame interval, the closest matching LPC reference signal index $I_a$ for the input signal is generated in LPC vector search processor 230 in FIG. 2. The closest matching excitation index $I_e$ for the input signal is also produced in excitation search processor 250. These two indices are combined into a frame representative code in multiplexer 255. Where the coder of FIG. 2 is used in a communication system, the code comprising signals $I_a$ and $I_e$ are conditioned for transmission and are applied to channel 260.

Figure 4:
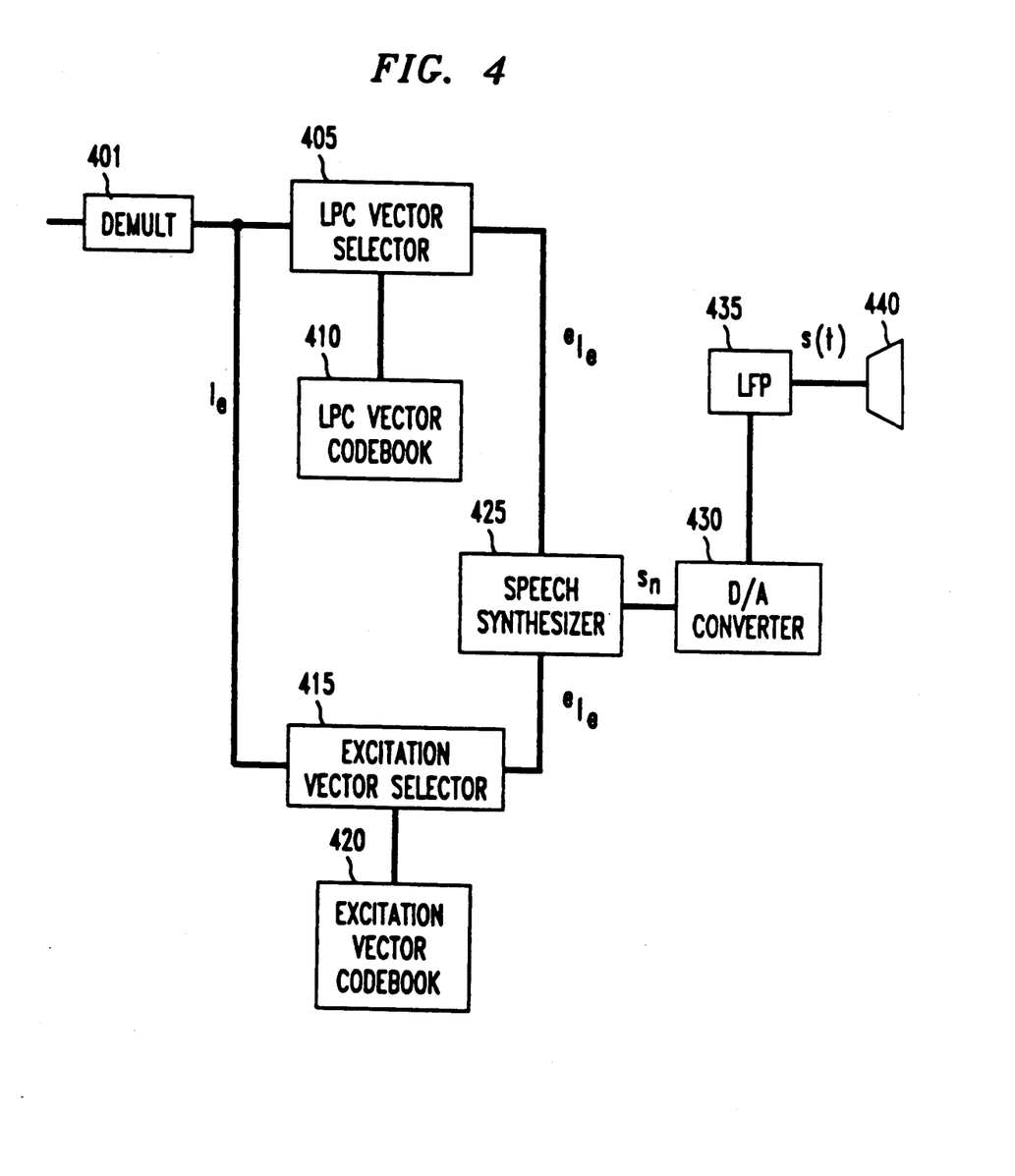
FIG. 4 is a general block diagram of a vector quantization speech decoding arrangement illustrative of the invention.
Figure 8:
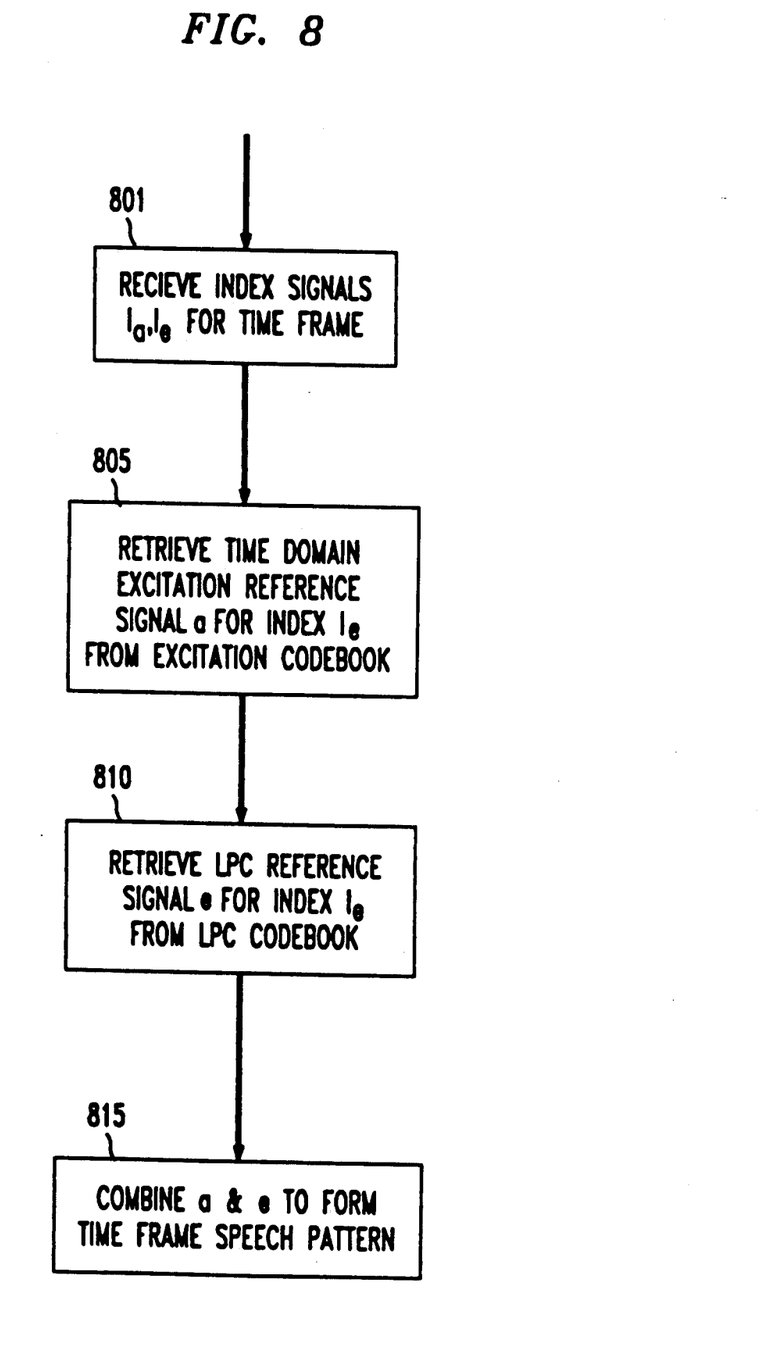
FIG. 8 is a flowchart illustrating the operation of the decoder of FIG. 4.

FIG. 4 shows a decoder adapted to convert index signals $I_a$ and $I_e$ into a speech pattern for the time frame interval. FIG. 8 is a flowchart illustrating the operation of the decoder of FIG. 4. The code comprising indices $I_a$ and $I_e$ for each time frame is received (step 801 of FIG. 8) and the decoder of FIG. 4 separates the indices in demultiplexer 401. The LPC index $I_a$ is supplied to LPC vector selector 405. The LPC vector selector uses index $I_a$ to address the corresponding reference code in LPC codebook 410. Codebook 410 has the same reference signals stored therein as in codebook 235 of FIG. 2. The corresponding LPC reference code $a_{I_a}$ is retrieved from codebook 410 (step 805) and is applied to speech synthesizer 425. The synthesizer may be any of the LPC synthesizers well known in the art.

Index signal $I_e$ from demultiplexer 401 is applied to excitation vector selector 415. The excitation index signal addresses excitation vector codebook 420. This excitation vector codebook contains time domain excitation reference signals that can be used directly as excitation signals for speech synthesizer 425. The time domain excitation reference signal corresponding to index $I_e$ is retrieved (step 810) and applied to synthesizer 425. Speech synthesizer 425 combines the present time frame LPC signals $a_{I_a}$ from selector 405 with the present time frame excitation signal $e_{I_e}$ from selector 415 (step 815) and forms a digital signal $s_n$ replicating the time frame input signal applied to the coder of FIG. 2.

Digital to analog converter 430 generates a sequence of samples representing the speech pattern of the present time frame. Low pass filter 435 removes unwanted high frequency components from the sample sequence to form an analog speech signal and transducer 440 converts the analog speech signal into a sound pattern. The operations of LPC vector selector 405, excitation vector selector 415 and speech synthesizer 425 may be performed in a signal processor arrangement such as shown in FIG. 3 by techniques well known in the art.

The invention has been described with reference to illustrative embodiments thereof. It is apparent, however, to one skilled in the art that various modifications and changes may be made without departing from the spirit and scope of the invention. While the invention has been described with respect to a speech communication coding arrangement, it is equally applicable to image type coding arrangements and may be used in systems wherein speech or images are encoded and stored in a recording medium for later retrieval.

I claim:

1. A method for coding a multi-element signal comprising the steps of:

storing a plurality of multi-element reference signals $y_1, y_2, \ldots, y_N$ in a codebook storage array representable in a prescribed vector space;

receiving a multi-element input signal x representable in the prescribed vector space; and selecting one of the stored reference signals $y_m$ to represent the multi-element input signal;

the selecting step including:

selecting a predetermined orientation of a reference line for projection mapping in the prescribed vector space, forming a set of signals each representative of the projection $p_{yn}$ of the reference signal $y_n$ on the reference line with the predetermined orientation in the prescribed vector space, forming a signal representative of the projection $p_x$ of the input signal on the reference line with the predetermined orientation in the prescribed vector space, choosing one or more of the stored reference signals $y_i$ responsive to their projections $p_{yi}$ on the reference line with the predetermined orientation, generating for each chosen reference signal $y_i$, a signal representative of the difference between the reference signal projection and the input signal projection on the reference line with the predetermined orientation $|p_{yi}-p_x|$ responsive to the reference signal projection $p_x$, and input signal projection $p_x$, and determining the reference signal $y_m$ that most closely matches the input signal responsive to the projection difference signals.

2. A method for coding a multi-element signal according to claim 1 wherein the stored reference signals are arranged in the order of their projections on the reference line with the predetermined orientation $p_{y1} < p_{y2} < \ldots < p_{yN}$, and the step of choosing one or more reference signals comprises successively selecting reference signals $y_i$ in the order of increasing distance of their projections $p_{yi}$ from the input signal projection $p_x$.

3. A method for coding a multi-element signal according to claim 2 wherein the step of determining the reference signal $y_m$ that most closely matches the input signal responsive to the projection difference signals comprises initially setting a signal m corresponding to the index of the most closely matching reference signal to a value greater than N and a signal $d_m$ corresponding to the distance between the closest matching reference signal $y_m$ and the input signal x to a value greater than the largest distance between any of the reference signals and the input signal in the prescribed vector space, for each successively selected reference signal $y_i$, comparing the projection distance signal $|p_{yi}-p_x|$ to the distance signal $d_m$, responsive to the selected reference signal projection distance $|p_{yi}-p_x|$ being less than prescribed vector space distance $d_m$ in the comparing step, (a) forming a signal corresponding to the vector space distance $d(y_i, x)$ between the input signal x and the reference signal $y_i$ in the prescribed vector space, (b) replacing the vector space distance signal $d_m$ with vector space distance signal $d(y_i, x)$ responsive to $d(y_i, x) < d_m$, (c) setting the selected reference signal index m equal to reference signal index i, and (d) returning to the comparing step for the next successively chosen reference signal i, and responsive to the selected reference signal projection distance $p_{yi}$ being equal to or greater than vector space distance $d_m$ in the comparing step, selecting reference signal m as the closest matching reference signal.

4. A method for coding a multi-element signal according to claims 1, 2 or 3 wherein the predetermined orientation of the reference line in the prescribed vector space corresponds to a predetermined element of the multi-element input signal.

5. A method for coding a multi-element signal according to claims 1, 2 or 3 wherein the multi-element input signal is a speech representative signal.

6. A method for coding a multi-element signal according to claims 1, 2 or 3 wherein the multi-element input signal is an image representative signal.

7. In a signal processing system having a memory for storing a plurality of multi-element reference signals representable in a prescribed vector space, the method of coding a multi-element signal comprising the steps of;

receiving a multi-element input signal x representable in the prescribed vector space; and selecting one of the stored reference signals $y_m$ to represent the multi-element input signal;

the selecting step including;

selecting a predetermined orientation of a reference line for protection mapping in the prescribed vector space, forming a set of signals each representative of the projection $p_{yn}$ of the reference signal $y_n$ on the predetermined orientation of the reference line in the prescribed vector space, forming a signal representative of the projection $p_x$ of the input signal on the reference line with the predetermined orientation in the prescribed vector space, choosing one or more of the stored reference signals $y_i$ responsive to their projections $p_{yi}$ on the reference line with the predetermined orientation, generating for each chosen reference signal $y_i$, a signal representative of the difference between the reference signal projection and the input signal projection on the reference line with the predetermined orientation $|p_{yi}-p_x|$ responsive to the reference signal projection $p_{yi}$ and input signal projection $p_x$, and determining the reference signal $y_m$ that most closely matches the input signal responsive to the projection difference signals.

8. In a signal processing system having a memory for storing a plurality of multi-element reference signals representable in a prescribed vector space, the method of coding a multi-element signal according to claim 7 wherein the stored reference signals are arranged in the order of their projections on the reference line with the predetermined orientation $p_{y1} < p_{y2} < \ldots < p_{yN}$, and the step of choosing one or more reference signals comprises successively selecting reference signals $y_i$ in the order of increasing distance $|p_{yi}-p_x|$ from the input signal projection $p_x$.

9. In a signal processing system having a memory for storing a plurality of multi-element reference signals representable in a prescribed vector space, the method of coding a multi-element signal according to claim 8 wherein the step of determining the reference signal $y_m$ that most closely matches the input signal responsive to the projection difference signals comprises initially setting a signal m corresponding to the index of the most closely matching reference signal to a value greater than N and a signal $d_m$ corresponding to the distance $d(y_m,x)$ between the closest matching reference signal $y_m$ and the input signal x to a value greater than the largest distance between any of the reference signals and the input signal in the prescribed vector space, for each successively selected reference signal $y_i$, comparing the projection distance signal $|p_{yi}-p_x|$ to the distance signal $d_m$, responsive to the selected reference signal projection distance $|p_{yi}-p_x|$ being less than prescribed vector space distance $d_m$ in the comparing step, (a) forming a signal corresponding to the vector space distance $d(y_i,x)$ between the input signal x and the reference signal $y_i$ in the prescribed vector space, (b) replacing the vector space distance signal $d_m$ with vector space distance signal $d(y_i,x)$ responsive to $d(y_i,x)<d_m$, (c) setting the selected reference signal index m equal to reference signal index i, and (d) returning to the comparing step for the next successively chosen reference signal i, and responsive to the selected reference signal projection distance $|p_{yi}-p_x|$ being equal to or greater than vector space distance $d_m$ in the comparing step, selecting reference signal $y_m$ as the closest matching reference signal.

10. In a signal processing system having a memory for storing a plurality of multi-element reference signals representable in a prescribed vector space, the method of coding a multi-element signal according to claim 7, 8 or 9 wherein the predetermined orientation at the reference line in the prescribed vector space corresponds to a predetermined element of the multi-element input signal.

11. In a signal processing system having a memory for storing a plurality of multi-element reference signals representable in a prescribed vector space, the method of coding a multi-element signal according to claims 7, 8 or 9 wherein the multi-element input signal is a speech representative signal.

12. In a signal processing system having a memory for storing a plurality of multi-element reference signals representable in a prescribed vector space, the method of coding a multi-element signal according to claims 7, 8 or 9 wherein the multi-element input signal is an image representative signal.

13. Apparatus for coding a multi-element signal comprising:

means for storing a plurality of multi-element reference signals $y_1, y_2, \ldots, y_n$ in a codebook storage array representable in a prescribed vector space;

means for receiving a multi-element input signal x representable in the prescribed vector space; and means for selecting one of the stored reference signals $y_m$ to represent the multi-element input signal;

the selecting means including:

means for selecting a predetermined orientation of a reference line for projection mapping in the prescribed vector space, means responsive to the reference signals and the predetermined orientation for forming a set of signals each representative of the projection $p_{yn}$ of the reference signal $y_n$ on the reference line with the predetermined orientation in the prescribed vector space, means responsive to the input signal and the predetermined orientation for forming a signal representative of the projection $p_x$ of the input signal on the reference line with the predetermined orientation in the prescribed vector space, means responsive to the projections $p_{yn}$ on the reference line with the predetermined orientation of the reference signals $y_n$ for choosing one or more of the stored reference signals $y_i$, means responsive to the reference signal projection $p_{yi}$ and input signal projection $p_x$ for generating for each chosen reference signal $y_i$, a signal representative of the difference between the reference signal projection and the input signal projection on the reference line with the predetermined orientation $|p_{yi}-p_x|$, and means responsive to the projection difference signals for determining the reference signal $y_m$ that most closely matches the input signal.

14. Apparatus for coding a multi-element signal according to claim 13 wherein the stored reference signals are arranged in the order of their projections on the reference line with the predetermined orientation $p_{y1}<p_{y2}< \ldots <p_{yN}$, and the means for choosing one or more reference signals comprises means responsive to the reference projection signal $p_{yn}$ and the input projection signal $p_x$ for successively selecting reference signals $y_i$ in the order of increasing distance from the input signal projection $p_x$.

15. Apparatus for coding a multi-element signal according to claim 14 wherein the means for determining the reference signal $y_m$ that most closely matches the input signal responsive to the projection difference signals comprises means for initially setting a signal m corresponding to the index of the most closely matching reference signal to a value greater than N and a signal $d_m$ corresponding to the distance between the closest matching reference signal $y_m$ and the input signal x to a value greater than the largest distance between any of the reference signals and the input signal in the prescribed vector space, means operative for each successively selected reference signal $y_i$ for comparing the projection distance signal $|p_{yi}-p_x|$ to the distance signal $d_m$, means responsive to the selected reference signal projection distance $|p_{yi}-p_x|$ being less than prescribed vector space distance $d_m$ in the comparing means for forming a signal corresponding to the vector space distance $d(y_i,x)$ between the input signal x and the reference signal $y_i$ in the prescribed vector space, means responsive to $d(y_i,x)<d_m$ for replacing the vector space distance signal $d_m$ with the vector space distance signal $d(y_i,x)$ and for setting the selected reference signal index m equal to reference signal index i, and means responsive to the selected reference signal projection distance $|p_{yi}-p_x|$ being equal to or greater than vector space distance $d_m$ in the comparing means for selecting reference signal $y_m$ as the closest matching reference signal.

16. Apparatus for coding a multi-element signal according to claims 13, 14 or 15 wherein the predetermined orientation in the prescribed vector space corresponds to a predetermined element of the multi-element input signal.

17. Apparatus for coding a multi-element signal according to claims 13, 14 or 15 wherein the multi-element input signal is a speech representative signal.

18. Apparatus for coding a multi-element signal according to claims 13, 14 or 15 wherein the multi-element input signal is an image representative signal.

19. A method for coding a speech signal comprising:
partitioning the speech signal into a sequence of time frame intervals, generating a multi-element signal $x_a$ corresponding to the predictive parameters for the speech signal of each time frame interval and representable in a prescribed vector space, storing a plurality of multi-element reference signals $a_1, a_2, \ldots, a_N$ representable in the prescribed vector space; and selecting one of the stored reference signals $a_m$ to represent the multi-element input signal $x_a$;

the selecting step including:

selecting a predetermined orientation of a reference line for projecting mapping in the prescribed vector space, forming a set of signals each representative of the projection $p_{an}$ of the reference signal on the reference line with the predetermined orientation in the prescribed vector space, forming a signal representative of the projection $p_{xa}$ of the input signal on the reference line with the predetermined orientation in the prescribed vector space, choosing one or more of the stored reference signals $a_i$ responsive to their projections $p_{ai}$ on the reference line with the predetermined orientation, generating for each chosen reference signal $a_i$, a signal representative of the difference between the reference signal projection and the input signal projection on the reference line with the predetermined orientation $|p_{ai}-p_{xa}|$ responsive to the reference signal projection $p_{ai}$ and input signal projection $p_{xa}$, and determining the reference signal $a_m$ that most closely matches the input signal responsive to the projection difference signals $|p_{ai}-p_{xa}|$.

20. A method for coding a multi-element signal according to claim 19 wherein
the stored reference signals are arranged in the order of their projections on the reference line with the predetermined orientation $p_{a1} < p_{a2} < \ldots < p_{aN}$, and the step of choosing one or more reference signals comprises successively selecting reference signals $a_i$ in the order of increasing distance of their projections $p_{ai}$ from the input signal projection $p_{xa}$.

21. A method for coding a multi-element signal according to claim 20 wherein the step of determining the reference signal $a_m$ that most closely matches the input signal responsive to the projection difference signals comprises initially setting a signal m corresponding to the index of the most closely matching reference signal to a value greater than N and a signal $d_m$ corresponding to the distance between the closest matching reference signal $a_m$ and the input signal $x_a$ to a value greater than the largest distance between any of the reference signals and the input signal in the prescribed vector space, for each successively selected reference signal $a_i$, comparing the projection distance signal $|p_{ai}-p_{xa}|$ to the distance signal $d_m$, responsive to the selected reference signal projection distance $|p_{ai}-p_{xa}|$ being less than prescribed vector space distance $d_m$ in the comparing step (a) forming a signal corresponding to the vector space distance $d(a_i,x_a)$ between the input signal $x_a$ and the reference signal $a_i$ in the prescribed vector space, (b) replacing the vector space distance signal $d_m$ with vector space distance signal $d(a_i,x_a)$ responsive to $d(a_i,x_a) < d_m$, (c) setting the selected reference signal index m equal to reference signal index i, and (d) returning to the comparing step for the next successively chosen reference signal i, and responsive to the selected reference signal projection distance $|p_{ai}-p_{xa}|$ being equal to or greater than vector space distance $d_m$ in the comparing step, selecting reference signal m as the closest matching reference signal.

22. A method for coding a speech signal comprising:
partitioning the speech signal into a sequence of time frame intervals, generating a multi-element signal $x_e$ corresponding to the excitation for the speech signal of each time frame interval, converting the multi-element excitation signal $x_e$ into a signal $x_e'$ representable in a prescribed transform domain vector space, storing a plurality of multi-element reference signals $e_1', e_2', \ldots, e_N'$ representable in the prescribed transform domain vector space; and selecting one of the stored reference signals $e_m'$ to represent the multi-element input signal $x_e$;

the selecting step including:

selecting a predetermined orientation of a reference line for protection mapping in the prescribed transform domain vector space;

forming a set of signals each representative of the projection $p_{en'}$ of the reference signal $e_n'$ on the reference line with the predetermined orientation in the prescribed transform domain vector space, forming a signal representative of the projection $p_{xe'}$ of the input signal on the reference line with the predetermined orientation in the prescribed transform domain vector space, choosing one or more of the stored reference signals $e_i'$ responsive to their projections $p_{ei'}$ on the reference line with the predetermined orientation, generating for each chosen reference signal $e_i'$, a signal representative of the difference between the reference signal projection and the input signal projection on the reference line with the predetermined orientation $|p_{ei'}-p_{xe'}|$ responsive to the reference signal projection $p_{ei}^t$ and input signal projection $p_{xe}^t$, and determining the reference signal $e_m^t$ that most closely matches the input signal responsive to the projection difference signals $|p_{ei}^t - p_{xe}^t|$.

23. A method for coding a multi-element signal according to claim 22 wherein the stored reference signals are arranged in the order of their projections on the reference line with the predetermined orientation $p_{e1}^t < p_{e2}^{t2} < \ldots < p_{eN}^t$, and the step of choosing one or more reference signals comprises successively selecting reference signals $e_i^t$ in the order o increasing distance of their projections $p_{ei}^t$ from the input signal projection $p_{xe}^t$.

* * * * *